(12) United States Patent
Khan et al.

(10) Patent No.: US 11,899,517 B2
(45) Date of Patent: Feb. 13, 2024

(54) EVENT ANALYSIS AND DISPLAY

(71) Applicant: Schweitzer Engineering Laboratories, Inc., Pullman, WA (US)

(72) Inventors: Md Arif Khan, Pullman, WA (US); Gregory C. Zweigle, Pullman, WA (US); Jared Kyle Bestebreur, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 52 days.

(21) Appl. No.: 17/822,023

(22) Filed: Aug. 24, 2022

(65) Prior Publication Data

US 2023/0060977 A1    Mar. 2, 2023

Related U.S. Application Data

(60) Provisional application No. 63/237,327, filed on Aug. 26, 2021.

(51) Int. Cl.
*G06F 1/3218* (2019.01)
*H03H 17/04* (2006.01)
(Continued)

(52) U.S. Cl.
CPC .......... *G06F 1/3218* (2013.01); *G01R 25/00* (2013.01); *G06F 3/14* (2013.01);
(Continued)

(58) Field of Classification Search
None
See application file for complete search history.

(56) References Cited

U.S. PATENT DOCUMENTS 3,164,771 A   1/1965  Milford
3,258,692 A   6/1966  Jacomini
(Continued)

FOREIGN PATENT DOCUMENTS

WO   2005015366 A2   2/2005
WO   2006052215 A1   5/2006

OTHER PUBLICATIONS

Ray Klump, et al. Visualizing Real-Time Security Threats using Hybrid SCADA/PMU Measurement Displays, 38th Hawaii International Conference, IEEE No. 0-7695-2268-8/2005.
(Continued)

*Primary Examiner* — Nicholas J Lee
(74) *Attorney, Agent, or Firm* — Fletcher Yoder, P.C.

(57) ABSTRACT

Techniques and apparatus presented herein are directed toward monitoring an electric power delivery system to detect and locate a power generation event. A power generation event may include a tripped generator, a loss of a transmission line, or other loss of power generation. To detect the event, an analysis engine may receive and monitor input data. A detection signal may be generated based on the input data. Upon detecting the event, the analysis engine may determine a source and propagation of the event through the delivery system. Based on the source and propagation of the event, the analysis engine may determine the location of the event. The analysis engine may generate an overlay with the input data to provide the location and other information about the event to a user such that remedial action can be taken to resolve the event and restore the lost power generation.

21 Claims, 15 Drawing Sheets

(51) Int. Cl.
*H02J 13/00* (2006.01)
*G01R 25/00* (2006.01)
*G06F 3/14* (2006.01)
*H03H 17/00* (2006.01)

(52) U.S. Cl.
CPC ....... *H02J 13/00002* (2020.01); *H03H 17/04* (2013.01); *H03H 2017/009* (2013.01)

(56) References Cited

U.S. PATENT DOCUMENTS

| | | | |
|---|---|---|---|
| 3,264,633 | A | 8/1966 | Hellar |
| 3,266,018 | A | 8/1966 | Higgins |
| 3,313,160 | A | 4/1967 | Goldman |
| 4,794,386 | A | 12/1988 | Bedrij et al. |
| 4,845,644 | A | 7/1989 | Anthias et al. |
| 5,519,861 | A | 5/1996 | Ryu et al. |
| 5,594,847 | A | 1/1997 | Moursund |
| 5,793,750 | A | 8/1998 | Schweitzer et al. |
| 5,917,483 | A | 6/1999 | Duncan et al. |
| 5,930,773 | A | 7/1999 | Crooks et al. |
| 5,943,656 | A | 8/1999 | Crooks et al. |
| 6,035,285 | A | 3/2000 | Schlect et al. |
| 6,052,671 | A | 4/2000 | Crooks et al. |
| 6,088,688 | A | 7/2000 | Crooks et al. |
| 6,229,536 | B1 | 5/2001 | Alexander et al. |
| 6,313,752 | B1 | 11/2001 | Corrigan et al. |
| 6,559,868 | B2 | 5/2003 | Alexander et al. |
| 6,618,648 | B1 | 9/2003 | Shirota et al. |
| 6,642,700 | B2 | 11/2003 | Slade et al. |
| 6,662,124 | B2 | 12/2003 | Schweitzer et al. |
| 6,754,597 | B2 | 6/2004 | Bertsch et al. |
| 6,845,333 | B2 | 1/2005 | Anderson et al. |
| 6,898,488 | B2 | 5/2005 | Kusaka et al. |
| 6,907,368 | B2 | 6/2005 | Bechtold et al. |
| 6,947,269 | B2 | 9/2005 | Lee et al. |
| 6,973,376 | B2 | 12/2005 | Kusaka et al. |
| 7,073,182 | B1 | 7/2006 | Osburn |
| 7,127,329 | B2 | 10/2006 | Kusaka et al. |
| 7,185,281 | B2 | 2/2007 | Farago et al. |
| 7,298,259 | B2 | 11/2007 | Moriwaki |
| 7,403,114 | B2 | 7/2008 | Moriwaki |
| 7,660,683 | B2 | 2/2010 | Cuthbertson et al. |
| 8,880,368 | B2 | 11/2014 | Hewitt et al. |
| 10,664,553 | B2 * | 5/2020 | Hewitt ................. G06F 17/18 |
| 10,802,081 | B2 * | 10/2020 | Bickel ................. G01R 21/133 |
| 11,152,916 | B2 * | 10/2021 | Halladay ............ H03H 17/0201 |
| 11,231,999 | B2 | 1/2022 | Halladay |
| 2001/0021896 | A1 | 9/2001 | Bertsch et al. |
| 2002/0008784 | A1 | 1/2002 | Shirata et al. |
| 2002/0080149 | A1 | 6/2002 | Alexander et al. |
| 2002/0120723 | A1 | 8/2002 | Forth et al. |
| 2002/0126157 | A1 | 9/2002 | Farago et al. |
| 2002/0145517 | A1 | 10/2002 | Papallo et al. |
| 2002/0159051 | A1 | 10/2002 | Guo |
| 2003/0105608 | A1 | 6/2003 | Hart |
| 2004/0111187 | A1 | 6/2004 | Kusaka et al. |
| 2004/0162642 | A1 | 8/2004 | Gasper et al. |
| 2005/0033481 | A1 | 2/2005 | Budhraja et al. |
| 2005/0114500 | A1 | 5/2005 | Monk et al. |
| 2005/0132241 | A1 | 6/2005 | Curt et al. |
| 2005/0143947 | A1 | 6/2005 | James |
| 2005/0203670 | A1 | 9/2005 | Kusaka et al. |
| 2005/0273183 | A1 | 12/2005 | Curt et al. |
| 2006/0095276 | A1 | 5/2006 | Axelrod et al. |
| 2006/0150224 | A1 | 7/2006 | Kamariotis |
| 2006/0161645 | A1 | 7/2006 | Moriwaki et al. |
| 2006/0202834 | A1 | 9/2006 | Moriwaki |
| 2006/0224336 | A1 | 10/2006 | Petras et al. |
| 2006/0259255 | A1 | 11/2006 | Anderson et al. |
| 2007/0171052 | A1 | 7/2007 | Moriwaki |
| 2007/0198708 | A1 | 8/2007 | Moriwaki et al. |
| 2008/0103631 | A1 | 5/2008 | Koliwad et al. |
| 2008/0235355 | A1 | 9/2008 | Spanier et al. |
| 2009/0012728 | A1 | 1/2009 | Spanier et al. |
| 2009/0030759 | A1 | 1/2009 | Castelli et al. |
| 2009/0089608 | A1 | 4/2009 | Guzman-Casillas |
| 2009/0099798 | A1 | 4/2009 | Gong et al. |
| 2009/0125158 | A1 | 5/2009 | Schweitzer et al. |
| 2009/0300165 | A1 | 12/2009 | Tuckey et al. |
| 2010/0002348 | A1 | 1/2010 | Donolo et al. |
| 2010/0238983 | A1 | 9/2010 | Banhegyesi |
| 2010/0324845 | A1 | 12/2010 | Spanier et al. |
| 2011/0066301 | A1 | 3/2011 | Donolo |
| 2011/0106589 | A1 | 5/2011 | Blomberg et al. |
| 2012/0166141 | A1 | 6/2012 | Watkins et al. |
| 2013/0198124 | A1 * | 8/2013 | Saarinen ................. G06N 5/02 706/46 |
| 2013/0346419 | A1 * | 12/2013 | Hewitt ................. G06F 16/31 707/746 |
| 2014/0100801 | A1 | 4/2014 | Banhegyesi et al. |
| 2014/0136002 | A1 | 5/2014 | Gopalakrishnan et al. |
| 2014/0207017 | A1 | 7/2014 | Gilmore et al. |
| 2015/0089027 | A1 * | 3/2015 | Zweigle ............ H02J 13/00001 709/219 |

OTHER PUBLICATIONS

T.W. Cease, Real-Time Monitoring of the TVA Power System ISSN 0865-0156/94-1994 IEEE.

D.T. Rizy—Evaluation of Distribution Analysis Software for DER Applications, Oak Ridge National Laboratory—Sep. 30, 2002.

SEL-5078-2 Synchrowave Central, available at: https://selinc.com/products/5078-2/ printed on Aug. 16, 2017.

SEL-5601-2 Synchrowave Event, available at: https://selinc.com/products/5601-2/ printed on Aug. 16, 2017.

IEEE Standard for Synchrophasors for Power Systems—IEEE Power Engineering Society , IEEE Std C37 118-2005 (Revision of IEEE Std 1344-1995), Mar. 22, 2006.

Jay Giri, Manu Parashar, John Wulf, SynchroPhasor Measurement-Based Applications for the Control Center, i-PCGRID Workshop, Mar. 31, 2011.

* cited by examiner

EVENT ANALYSIS AND DISPLAY

RELATED APPLICATION

This application claims priority from and benefit of U.S. Provisional Application Ser. No. 63/237,327 filed on 26 Aug. 2021 naming Md Arif Khan, Gregory C. Zweigle, and Jared Kyle Bestebreur as the inventors, titled "Electric Power System Event Analysis and Display" which is incorporated herein by reference in its entirety.

BACKGROUND

This disclosure relates to reliability of an electric power delivery system. More particularly, this disclosure relates to detecting, locating, and analyzing an event in a power delivery system which affects a stability and/or causes a power generation deficiency.

In an electric power delivery system, electric loads may be coupled to generators that are distributed at various locations over a relatively large geographic area. Loss of power generation (or a transmission line between a generator and a load) in the electric power delivery system may negatively impact the entire system. For example, a particular generator (and transmission lines) may provide power to multiple loads in the power delivery system. If that generator is unexpectedly taken off-line or the generated power is reduced for some reason (e.g., a power failure of the generator, a loose connection of a transmission line, a motor starting, or the like), it may be apparent that a problem occurred but it may not be immediately known what caused the issue or where the issue is located in the system. Analysis of the power failure may be time consuming and resource intensive to analyze each component in the system and attempt to identify the issue. That is, even after analysis, the source of the issue with the power system may not be identified and the issue may occur again.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION

Figure 1:
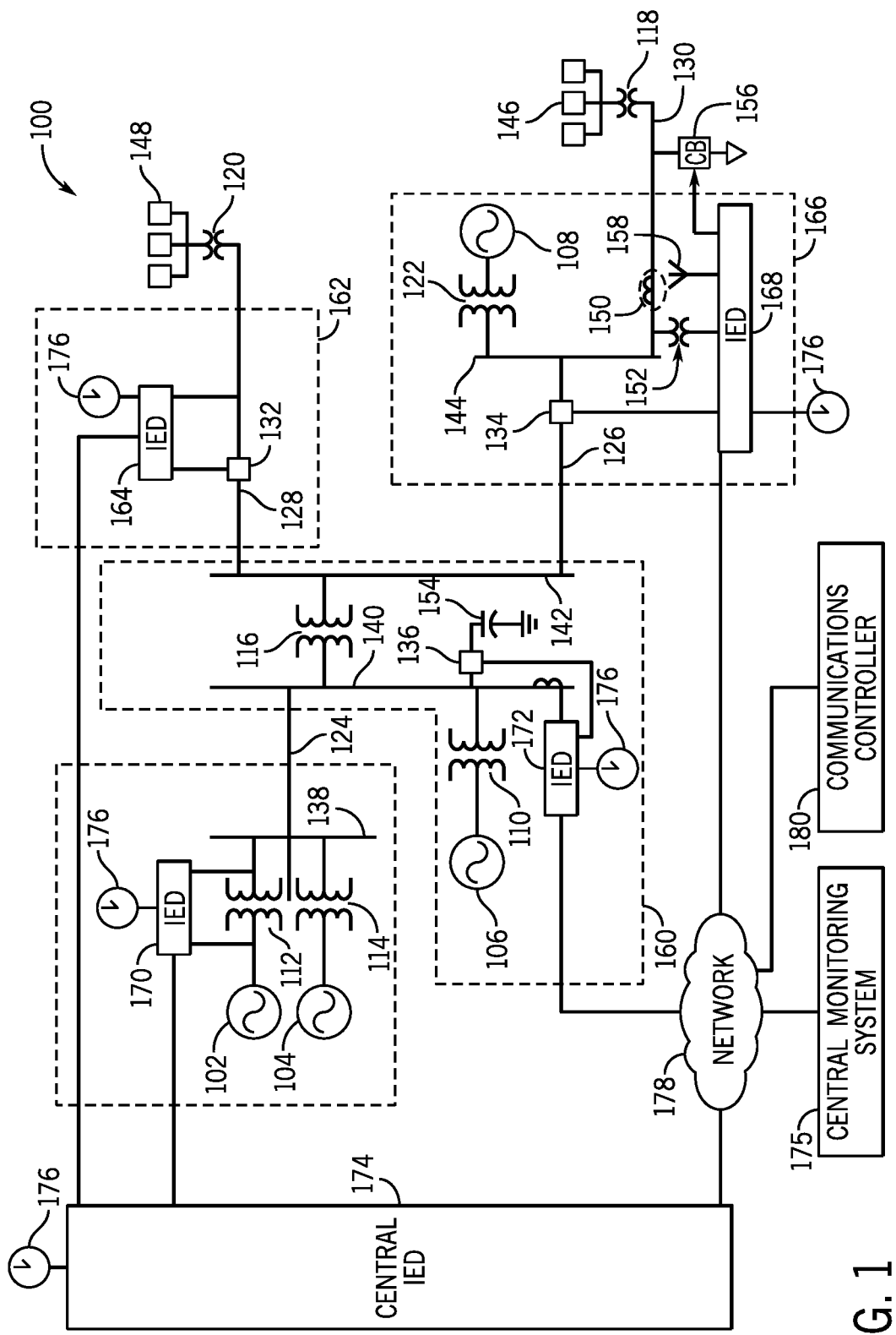
FIG. 1 illustrates a simplified diagram of an electric power delivery system, in accordance with embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment"

or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

In addition, several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Thus, embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

As discussed above, stability and power distribution of an electric power delivery system may be affected by a power generation event such as a power generation deficiency, an issue with a transmission line of the power delivery system, and the like. However, when a power generation event occurs, conventional approaches to identifying, locating, and analyzing a source of the event may be cumbersome and time consuming. For example, to identify a source of the event, an operator may check on each industrial asset (e.g., generator, load, transmission line, etc.) of a power delivery system until an issue is found with a particular asset that might have caused the event. Once the asset is found, the operator may still need to analyze data from that asset to identify a particular problem which potentially caused the event.

In some cases, the operator may learn from the analysis that the issue found was not the source of the problem, but a separate issue. In some cases, the operator may learn that an asset upstream of the particular asset may have caused the event. In that case, the operator may check each upstream asset to identify an issue with the power delivery system that may have caused the event. In some cases, once an issue is found and resolved, the operator may learn that the resolved issue was not the issue that caused the initial event. This process may be repeated until the actual issue that caused the event is found and resolved. Thus, the process to identify and locate the issue that caused the event may be time and resource intensive, leading to increased downtime of the power delivery system.

Embodiments presented herein provide techniques to identify, locate, and analyze a power generation event of an electric power delivery system relatively quickly. For example, an analysis engine may monitor input data, for example, in real-time, to detect a power generation event as the event occurs (e.g., concurrently) or shortly after (e.g., within a few seconds, such as within 1 second, 5 seconds, 10 seconds, 20 seconds, or 30 seconds, or within a few minutes, such as within 1 minutes, 2 minutes, 3 minutes, 5 minutes, 10 minutes, etc.) the event occurs. Once the event is detected, embodiments presented herein may include systems which analyze the event and related data to determine a location (e.g., geographic location) of the event or a related asset of the power delivery system and generate image content to illustrate how the event propagates through the power delivery system.

Advantageously, embodiments presented herein may enable near real-time monitoring of data associated with an electric power delivery system and generating image content and/or an alert based on the monitoring. As used herein, "near real-time monitoring" refers to monitoring that occurs quickly enough to rapidly perform remediation. Indeed, an event may be detected within a few milliseconds, within a few seconds, or within a few minutes of the original occurrence of the event. To do so, embodiments presented herein may receive and analyze input data to detect and identify a potential issue with the power delivery system or an asset of the power delivery system. For example, an analysis engine may receive the input data and determine whether an event has occurred. An event may include an issue with the power delivery system such as a tripped generator, a motor starting which may temporarily draw excess power from the delivery system, a loss of power generation, a loss of a transmission line, and the like. The near real-time monitoring of the input data may enable a relatively fast response time to correct the issue, such as performing remedial action such as repair or replacement of the asset of the delivery system. In this way, embodiments presented herein may reduce or eliminate down time for the delivery system and may reduce costs associated with debugging the entire delivery system to identify the issue such that remedial action may be taken.

FIG. 1 illustrates a simplified diagram of an electric power delivery system 100, in accordance with an embodiment of the present disclosure. The electric power delivery system 100 may generate, transmit, and/or distribute electric energy to one or more loads. As illustrated, the electric power delivery system 100 includes electric generators 102, 104, 106, and 108. The electric power delivery system 100 may also include power transformers 110, 112, 114, 116, 118, 120, and 122. Furthermore, the electric power delivery system may include lines 124, 126, 128, and 130 to transmit and/or deliver power. Circuit breakers 132, 134, and 136 may be used to control flow of power in the electric power delivery system 100. Busses 138, 140, 142, and 144 and/or loads 146 and 148 receive the power in and/or from (e.g., output by) the electric power delivery system 100. A variety of other types of equipment may also be included in electric power delivery system 100, such as current sensors (e.g., wireless current sensor (WCS) 150), potential transformers (e.g., potential transformer 152), voltage regulators, capacitors (e.g., capacitor 154) and/or capacitor banks (e.g., capacitor bank (CB) 156), antennas (e.g., antenna 158), and other suitable types of equipment useful in power generation, transmission, and/or distribution.

A substation 160 may include the electric generator 106, which may be a distributed generator, and which may be connected to the bus 140 through the power transformer 110 (e.g., a step-up transformer). The bus 140 may be connected to a distribution bus 142 via the power transformer 116 (e.g., a step-down transformer). Various distribution lines 126 and 128 may be connected to the distribution bus 142. The distribution line 128 may be connected to a substation 162 where the distribution line 128 is monitored and/or controlled using an intelligent electronic device (IED) 164, which may selectively open and close the circuit breaker 132. A load 148 may be fed from the distribution line 128. The power transformer 120 (e.g., a step-down transformer), in communication with the distribution bus 142 via distribution line 128, may be used to step down a voltage for consumption by the load 148.

A distribution line 126 may deliver electric power to a bus 144 of a substation 166. The bus 144 may also receive electric power from a distributed generator 108 via transformer 122. The distribution line 130 may deliver electric power from the bus 144 to a load 146, and may include the power transformer 118 (e.g., a step-down transformer). A circuit breaker 134 may be used to selectively connect the bus 144 to the distribution line 126. The IED 168 may be used to monitor and/or control the circuit breaker 134 as well as the distribution line 130.

The electric power delivery system 100 may be monitored, controlled, automated, and/or protected using IEDs such as the IEDs 164, 168, 170, 172, and 174, and a central monitoring system 175. In general, the IEDs in an electric power generation and transmission system may be used for protection, control, automation, and/or monitoring of equipment in the system. For example, the IEDs may be used to monitor equipment of many types, including electric transmission lines, electric distribution lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

As used herein, an IED (e.g., the IEDs 164, 168, 170, 172, and 174) may refer to any processing-based device that monitors, controls, automates, and/or protects monitored equipment within the electric power delivery system 100. Such devices may include, for example, remote terminal units, merging units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system including multiple IEDs. Moreover, an IED of this disclosure may use a non-transitory computer-readable medium (e.g., memory) that may store instructions that, when executed by a processor of the IED, cause the processor to perform processes or methods disclosed herein. Moreover, the IED may include a wireless communication system to receive and/or transmit wireless messages from a wireless electrical measurement device. The wireless communication system of the IED may be able to communicate with a wireless communication system of the wireless electrical measurement devices, and may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, universal mobile telecommunication system (UMTS), long term evolution (LTE), long term evolution license assisted access (LTE-LAA), fifth-generation (5G) cellular, and/or 5G New Radio (5G NR) cellular). In some cases, the IEDs may be located remote from the respective substation and provide data to the respective substation via a fiber-optic cable.

A common time signal may be distributed throughout the electric power delivery system 100. Utilizing a common time source 176 may ensure that IEDs have a synchronized time signal that can be used to generate time synchronized data, such as synchrophasors. In various embodiments, the IEDs 164, 168, 170, 172, and 174 may be coupled to a common time source(s) 176 and receive a common time signal. The common time signal may be distributed in the electric power delivery system 100 using a communications network 178 and/or using a common time source 176, such as a Global Navigation Satellite System ("GNSS"), or the like.

According to various embodiments, the central monitoring system 175 may include one or more of a variety of types of systems. For example, the central monitoring system 175 may include a supervisory control and data acquisition (SCADA) system and/or a wide area control and situational awareness (WACSA) system. A central IED 174 may be in communication with the IEDs 164, 168, 170, and 172. The IEDs 164, 168, 170, and 172 may be located remote from the central IED 174, and may communicate over various media such as a direct communication from IED 164 or over the communications network 178. According to various embodiments, some IEDs may be in direct communication with other IEDs. For example, the IED 170 may be in direct communication with the central IED 174. Additionally or alternatively, some IEDs may be in communication via the communications network 178. For example, the IED 168 may be in communication with the central IED 174 via the communications network 178. In some embodiments, an IED may refer to a relay, a merging unit, or the like.

Communication via the communications network 178 may be facilitated by networking devices including, but not limited to, multiplexers, routers, hubs, gateways, firewalls, and/or switches. In some embodiments, the IEDs and the network devices may include physically distinct devices. In certain embodiments, the IEDs and/or the network devices may be composite devices that may be configured in a variety of ways to perform overlapping functions. The IEDs and the network devices may include multi-function hardware (e.g., processors, computer-readable storage media, communications interfaces, etc.) that may be utilized to perform a variety of tasks that pertain to network communications and/or to operation of equipment within the electric power delivery system 100.

A communications controller 180 may interface with equipment in the communications network 178 to create a software-defined network (SDN) that facilitates communication between the IEDs 164, 168, 170, 172, and 174 and the central monitoring system 176. In various embodiments, the communications controller 180 may interface with a control plane (not shown) in the communications network 178. Using the control plane, the communications controller 180 may direct the flow of data within the communications network 178.

The communications controller 180 may receive information from multiple devices in the communications network 178 regarding transmission of data. In embodiments in which the communications network 178 includes fiber optic communication links, the data collected by the communications controller 180 may include reflection characteristics, attenuation characteristics, signal-to-noise ratio characteristics, harmonic characteristics, packet loss statics, and the like. In embodiments in which the communications network 178 includes electrical communication links, the data collected by the communications controller 180 may include voltage measurements, signal-to-noise ratio characteristics, packet loss statics, and the like. In some embodiments, the communications network 178 may include both electrical and optical transmission media. The information collected by the communications controller 180 may be used to assess a likelihood of a failure, to generate information about precursors to a failure, and to identify a root cause of a failure. The communications controller 180 may associate information regarding a status of various communication devices and communication links to assess a likelihood of a failure. Such associations may be utilized to generate information about the precursors to a failure and/or to identify root cause(s) of a failure consistent with embodiments of the present disclosure.

Figure 2:
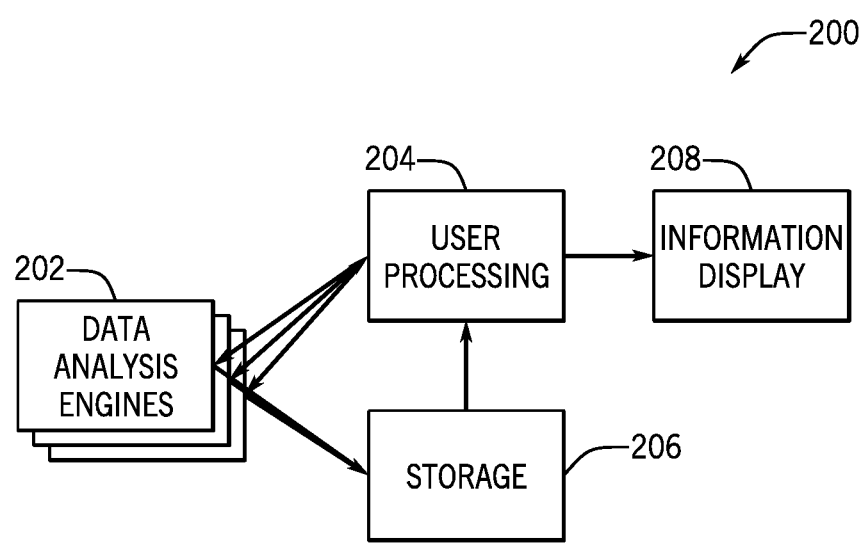
FIG. 2 is a schematic diagram of system for detecting, locating, and analyzing an event in an electric power delivery system, according to embodiments of the present disclosure.

FIG. 2 is a schematic diagram of system 200 for detecting, locating, and analyzing an event in an electric power delivery system, such as the delivery system 100 of FIG. 1, according to embodiments of the present disclosure. The system 200 may be part of the power delivery system 100 of FIG. 1. For example, in some cases, at least a portion of the system 200 may be disposed in and/or controlled by an IED 164, 168, 170, 172, and 174 of FIG. 1. In some cases, at least a portion of the system 200 may be coupled to and/or controlled by the central monitoring system 175 or the communications controller 180 of FIG. 1.

As shown, the system includes a number of data analysis engines 202, a user processing component 204, storage 206, and an information display 208. The information display 208 may be associated with a desktop computer, a laptop computer, a tablet, or a mobile device. In some embodiments, the display 208 may include a touch screen, which may facilitate user interaction with a user interface of the system 100.

The data analysis engines 202 may be representative of processing circuitry to perform various functions discussed herein. For example, each data analysis engine 202 may perform analysis for a particular type of event that may occur, such as a power deficiency, a motor starting, a transmission line issue, and the like. In some cases, one or more of the data analysis engines 202 may include a machine learning model. When an analysis is performed for an event, the machine learning model may be updated. The updated machine learning model may be used by a data analysis engine 202 so that subsequent data analysis takes recent data and analytics into account. That is, the machine learning model may include historical data related to power generation events in the power delivery system 100 and/or other power delivery systems, such as delivery systems in different geographic regions. The machine learning model may be based on one or more machine learning algorithms such as decision tree learning or artificial neural network or regression analysis including linear regression or polynomial regression, and the like.

The storage 206 may be used to store analysis results from the data analysis engines 202 and historical data. A timestamp may be associated with each result from the data analysis engines 202. The storage 206 may include a system model of the power delivery system 100, which may be used by the data analysis engines 202 to identify an event, determine a location of the event, and otherwise analyze the event.

The user processing component 204 may obtain information from each data analysis engine 202 and from the storage 206. The information obtained by the user processing component 204 may include near real-time data and historical data. For example, the user processing component 204 may obtain the near real-time data from the data analysis engines 202 and the historical data may be obtained from the storage 206. The user processing component 204 may combine the near real-time data and the historical data to be displayed via the information display 208.

In some cases, the user processing component 204 may provide parameters for the information display 208. For example, the user processing component 204 may include parameters for how the information display 208 should display results from the data analysis engines 202, including text size, what information/notifications to be displayed, a time range for the data displayed, and the like. The parameters of the user processing component 204 may be defined by a user viewing the data via the information display 208. Additionally, the parameters used by the data analysis engines 202 (e.g., thresholds or hyperparameter) can be configured using the user processing component 204.

Figure 3:
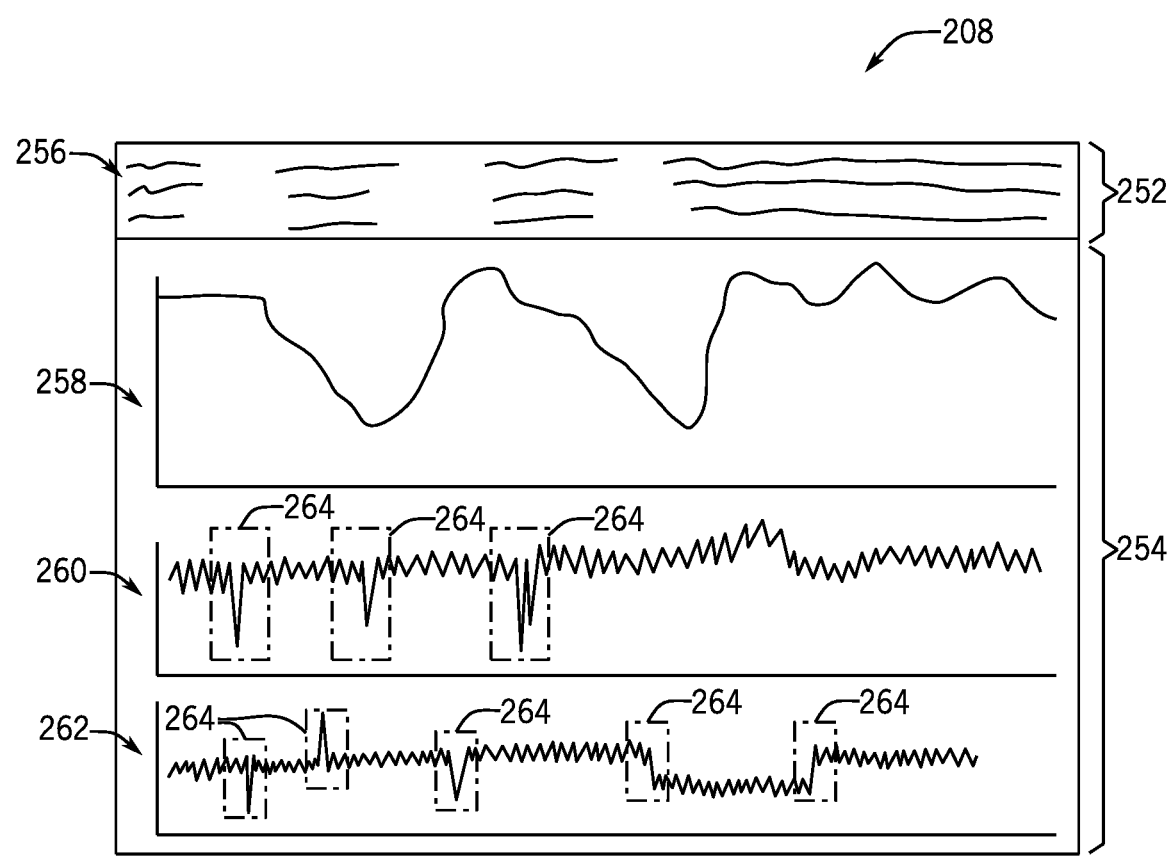
FIG. 3 is an example information display illustrating various features and information that may be output by the system of FIG. 2 and which may be used to visually identify an issue with the electric power delivery system, according to embodiments of the present disclosure.

FIG. 3 is an example information display 208 illustrating various features and information that may be output by the system 200 of FIG. 2 and which may be used to visually identify an issue with an electric power delivery system, such as the power delivery system 100 of FIG. 1, according to embodiments of the present disclosure. As shown, the information display 208 may be divided into a number of sections 252, 254. A first section 252 may include various information 256 related to the power delivery system. For example, the information 256 in the first section of 252 may include information related to various assets (e.g., equipment including generators, transformers, loads, etc.) of the delivery system such as a status, a voltage, a current, a frequency, an efficiency, and the like. A second section 254 may include various charts and/or graphs 258, 260, 262 depicting near real-time data from the various assets such as a voltage magnitude, a current magnitude, a frequency, and the like. The charts/graphs 258, 260, 262 may depict information associated with the overall delivery system or a particular asset of the delivery system.

Data depicted in the charts/graphs 258, 260, 262 may include features 264 that indicate an issue with an associated industrial asset or the power delivery system in general. However, without additional information, an operator of the power delivery system may not know what the features indicate. Thus, the operator may not be able to take proactive measures to prevent or reduce a loss of power propagating through the power delivery system. Embodiments presented herein provide techniques to include information regarding the features 264 as an overlay on the information display so that the operator (or anyone else) looking at the display 208 can quickly determine what the features 264 represent.

Figure 4A:
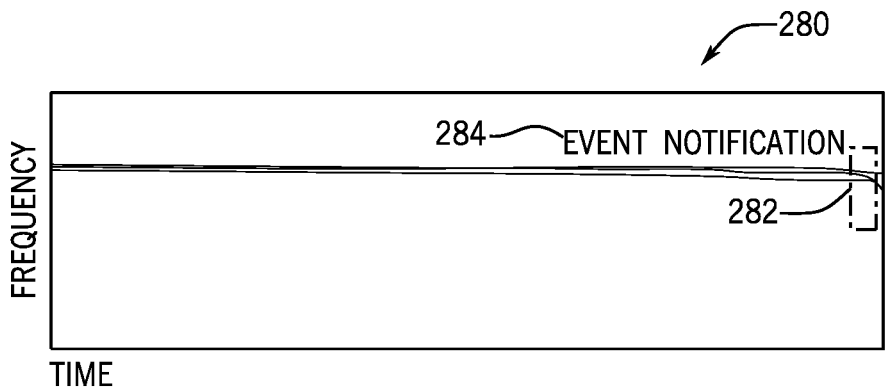
FIG. 4A illustrates a time series of input data received by the system of FIG. 2 with an event notification, according to embodiments of the present disclosure.
Figure 4B:
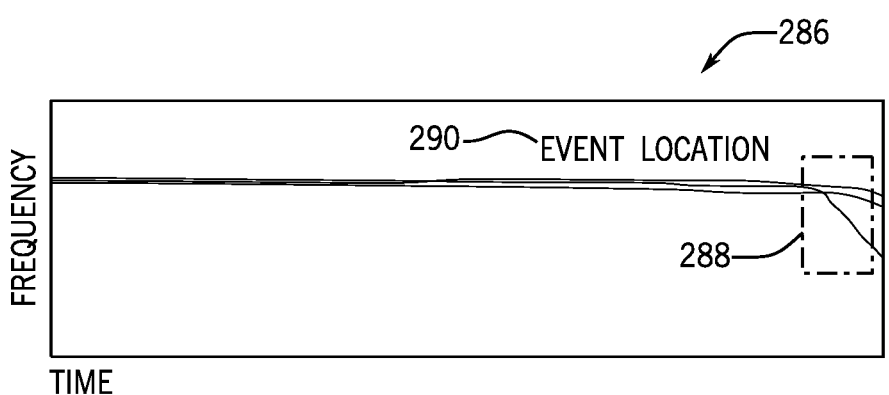
FIG. 4B illustrates the time series of input data of FIG. 4A with additional information related to the event notification, according to embodiments of the present disclosure.
Figure 4C:
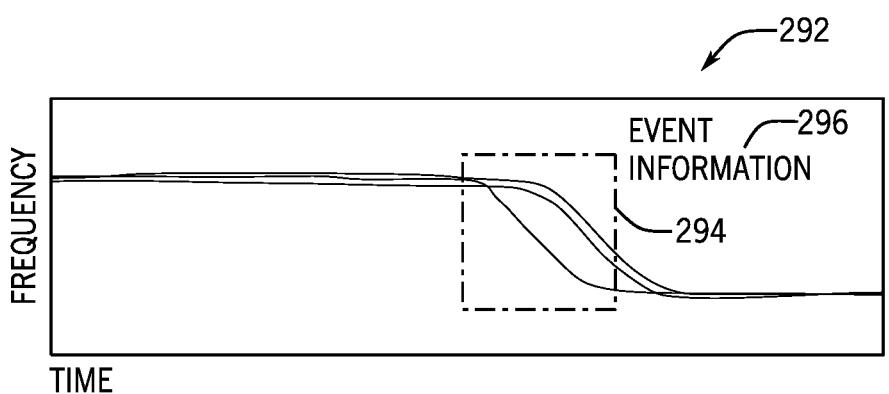
FIG. 4C illustrates the time series of input data of FIGS. 4A and 4B with additional information related to the event notification, according to embodiments of the present disclosure.

The information depicted in the charts/graphs 258, 260, 262 may scroll off the display 208 as new real-time data is received. For example, FIGS. 4A-4C illustrate a time series of a signal corresponding to an event detected for the power delivery system, according to embodiments of the present disclosure. Each of the graphs 280, 286, 292 depict the same signal being received from an asset of the power delivery system over time. That is, FIG. 4A illustrates the signal at a first time, FIG. 4B illustrates the signal at a second time after the first time of FIG. 4A, and FIG. 4C illustrates the signal at a third time after the second time. The graphs 280, 286, 292 of FIGS. 4A-4C may be representative of one of the charts/graphs 258, 260, 262 of FIG. 3. That is, the graphs 280, 286, 292 may be part of the information displayed on the information display 208.

As shown in FIG. 4A, when an event is detected by the data analysis engines 202 of FIG. 2, an event detection box 282 may be drawn on the graph 280 surrounding the signal from which the event was detected. An event notification 284 may be included near the box 282 on the graph 280. The event notification 284 may include a name of the asset where the event was detected and a type of event that was detected. For example, the event notification 284 may specify a name of a particular asset in the power delivery system and may identify the event as a loose connection within the substation. As another example, the event notification 284 may specify a name of a generator and indicate that the generator tripped causing a loss of power generation.

As shown in FIG. 4B, as time passes, additional data associated with the signal (e.g., the asset) is received and added to the graph 286. The event detection box 282 may move with the data across the information display 208. In some cases, the box 282 may expand into a larger box 288 such that additional data associated with the detected event is located within the box 288. Once a location of the event is determined via the analysis engines 202, the event notification 284 may be updated to include the location 290 of the event. That is, the box 282, 288 may be depicted on the information display 208 while the data analysis engines 202 are analyzing the input data related to the power delivery system. The event notification 284 may be updated as the data is analyzed and new information about the event is determined.

As shown in FIG. 4C, as time passes, additional data associated with the signal (e.g., the asset) is received and added to the graph 292. The event detection box 288 moves with the data related to the detected event and may expand into a larger box 294 to include all data related to the event within the box 294. As discussed above, when additional information 296 about the event is determined by the analysis engines 202, the information may be added to the event notification 284. The additional event information may include particular parameters related to the corresponding asset related to the detected event, such as a voltage, frequency, current, etc. associated with the asset. The additional event information may also include what may happen next based on the current state of the system and a suggestion on what may be done to keep the power system intact (e.g., repair or replacement of certain components of the power delivery system, load shedding, bringing additional generation online, restarting or rebooting a component of the power delivery system).

Even though new data related to the signal in the graphs 280, 286, 292 may continue to be received, a user of the system 200 of FIG. 2 may be able to change a time period displayed on the information display 208. For example, the user may zoom in to see more detailed information related to the event. In that case, the graphs 280, 286, 292 may continue to expand in time (e.g., to the right) even though the user has stopped a view of the graphs 280, 286, 292 from following the new data. In this way, a user can view a specific portion of the data related to the signal without affecting the near real-time data being received. Once the user has viewed the particular data, the user can zoom out on the graphs 280, 286, 292 to view the data as it is being received from the power delivery system.

In some embodiments, rather than using near real-time data, the graphs 280, 286, 292 may depict information related to historical data stored in the storage 206 of FIG. 2. For example, a user of the system 200 may select a historical time range from the historical data. In that case, the analysis engines 202 may analyze the selected historical data to identify any power generation events. When a power generation event is detected from the historical data, the graphs 280, 286, 292 may be updated to include an event detection box 282, 288, 294 and an event notification 284. In that case, the event notification 284 may include a location 290 of the event and any other relevant event information 296. That is, because the historical data was previously received, the analysis engines may have already analyzed the data to identify event information 296 (including a location of the event) and the event data 296 may be displayed with the initial event notification 284.

Figure 5:
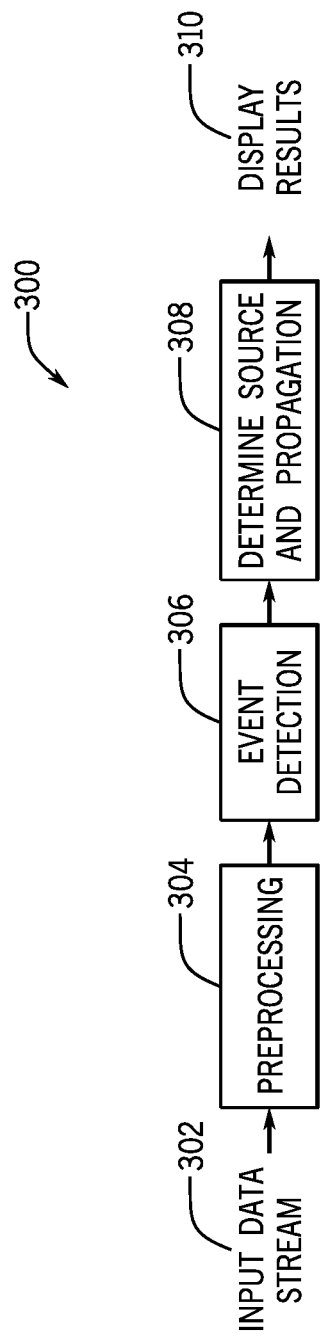
FIG. 5 is a functional block diagram of an example analysis engine of the system of FIG. 2, according to embodiments of the present disclosure.

FIG. 5 is a functional block diagram of an example analysis engine 300 of the system 200 of FIG. 2, according to embodiments of the present disclosure. The block diagram of the analysis engine 300 may be representative of an analysis engine 202 of FIG. 2. As shown, the analysis engine 300 performs various functions including preprocessing 304, event detection 306, and determining a source and propagation of the event 308. It should be understood that the analysis engine 300 may include more or fewer functions as needed to detect an event and determine relevant information related to the event for analysis.

The example discussed below relates to a generator trip in a power delivery system. Specifically, the example includes processing input data, detecting the generator trip event, and analyzing information related to the loss of power generation for the power delivery system. It should be understood that similar techniques may be implemented for different types of events such as an issue with a transmission line, starting of a motor which may temporarily draw excess power from the power delivery system, and the like.

Figure 6:
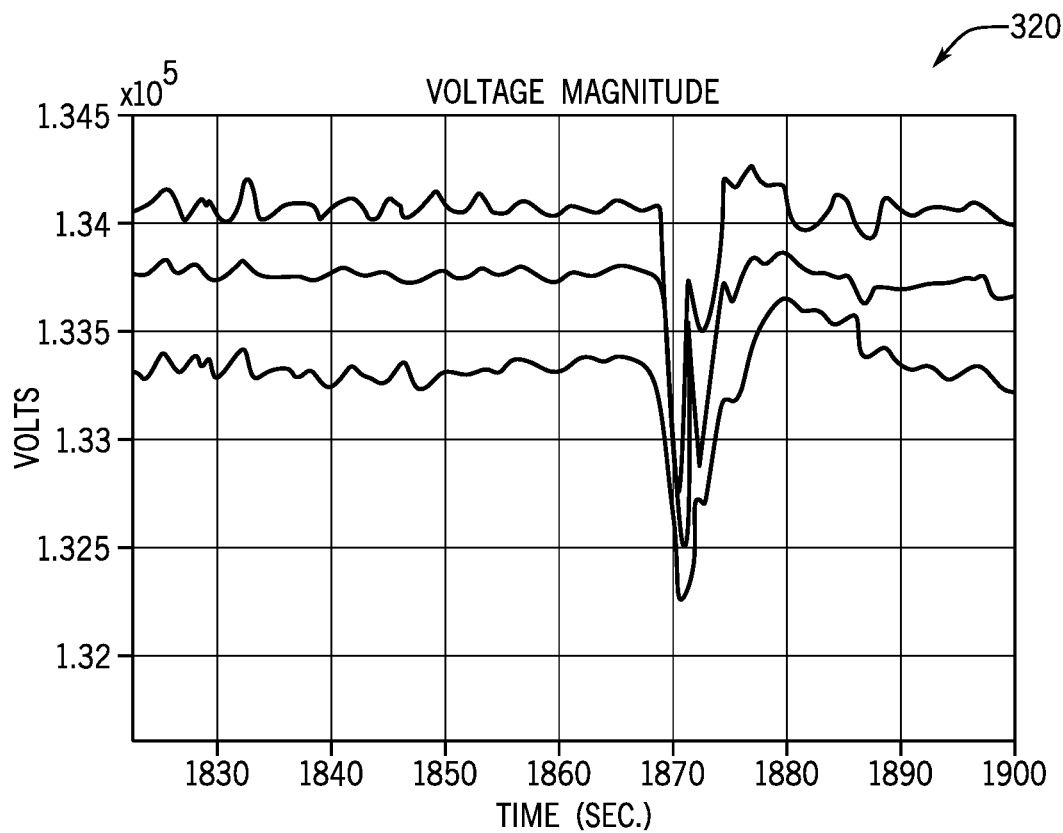
FIG. 6 is a chart depicting example voltage magnitude input of the analysis engine of FIG. 5, according to embodiments of the present disclosure.
Figure 7:
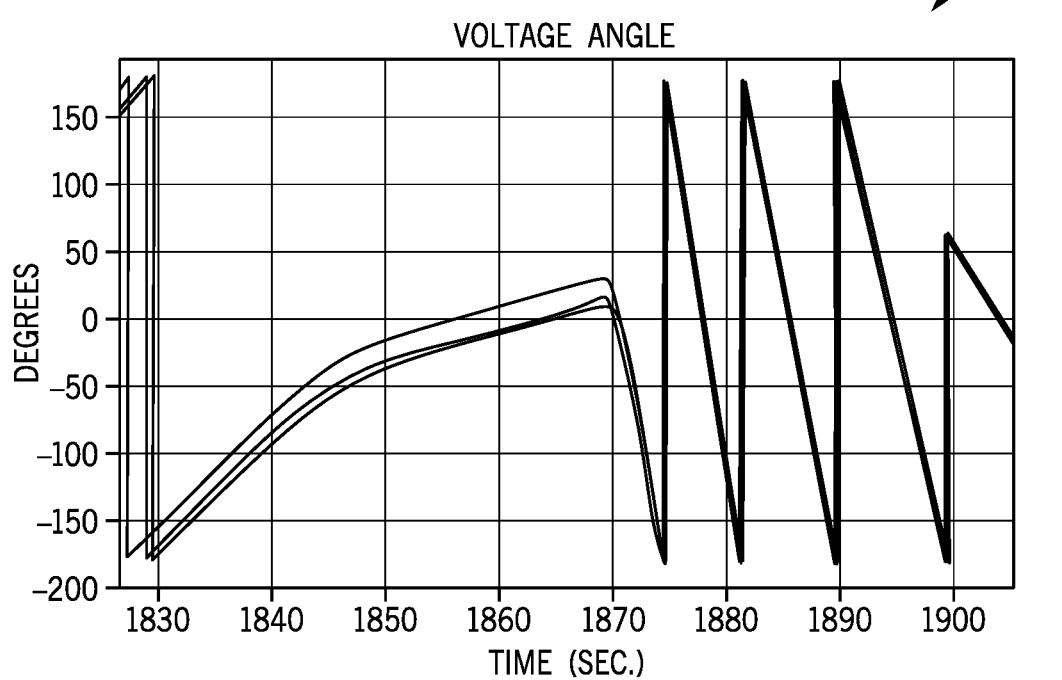
FIG. 7 is a graph depicting example voltage phase angle input of the analysis engine of FIG. 5, according to embodiments of the present disclosure.
Figure 8:
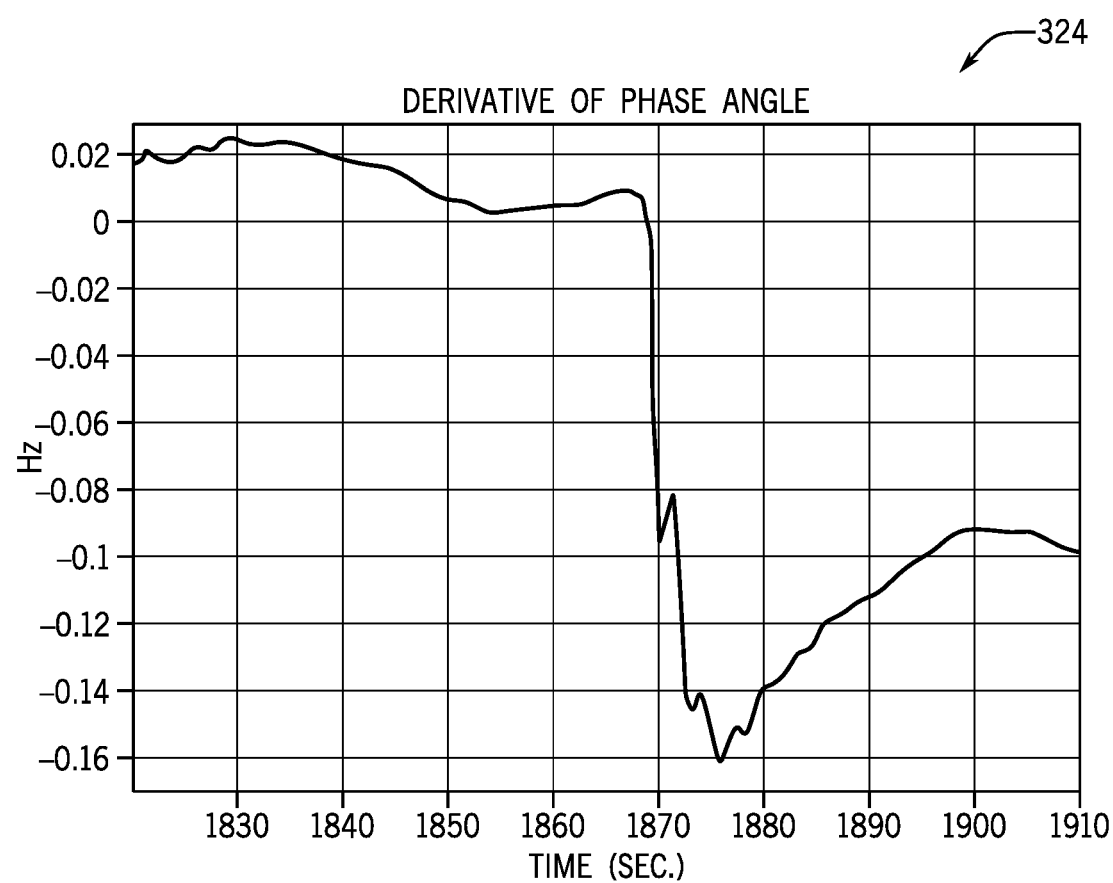
FIG. 8 is a graph depicting example derivative of phase angle calculated from the voltage magnitude and voltage phase angle of FIGS. 6 and 7, according to embodiments of the present disclosure.
Figure 11A:
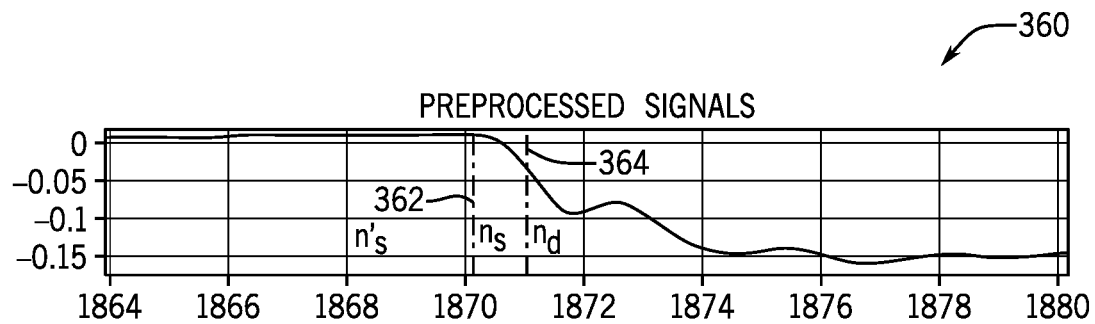
FIG. 11A is a graph illustrating a preprocessed signal, based on a derivative of phase, relative to a system frequency, according to embodiments of the present disclosure.

In operation, the analysis engine 300 receives an input data stream 302. The input data stream 302 may include complex voltage and/or current synchrophasors for the generator trip event. For example, the input data 302 may include a voltage magnitude signal 320, as illustrated in FIG. 6, and a voltage phase angle signal 322, as depicted in FIG. 7. Preprocessing 304 of the input data 302 may be performed by calculating a derivative of phase from voltage and current phasors. A resulting derivative 324 of the phase angle 322 of FIG. 7 is depicted in FIG. 8. FIG. 11A illustrates preprocessed signals 360 that may be determined during the preprocessing 304 operation.

The derivative of the phase 324 may be a deviation in frequency from the nominal frequency of the power delivery system. In some cases, a frequency signal may be obtained from a phasor measurement unit (PMU) of the delivery system. However, PMUs utilize various techniques to estimate a frequency signal. Thus, depending on the technique used by a particular PMU, the resulting frequency signal may be different for the same power delivery system. However, a difference in phase estimation by PMUs is substantially standardized based on the IEEE C37.118 standard for total vector errors and thus, phase estimation can be used reliably.

A median filter may be used to remove outliers and sudden changes from the frequency deviation signals 324. For example, a 0.2 second median filter (e.g., 6 samples at 30 samples per second) may be used. The sudden changes in the frequency deviation signals 324 may be caused by noise, communication errors, measurement errors, and the like. Outliers that are removed as well as missing data points in the frequency deviation signals 324 may be interpolated. For example, linear interpolation may be used to determine the missing or removed data points.

A low pass filter may be used to remove high frequency contents from the frequency deviation signals 324. For example, an equi-ripple finite impulse response (FIR) low pass filter may be used. As an example, the low pass filter may have a passband frequency of 1.5 Hz with a 0.02 decibel (dB) ripple and a stopband of 2.5 Hz with a 50 dB ripple.

Once preprocessing 304 of the input signal 302 is completed, the analysis engine 300 may perform event detection 306 to identify the generator trip. To do so, the analysis engine may pass the preprocessed signal (e.g., the derivative of the phase 324 of FIG. 8) through an infinite impulse response (IIR) filter. For example, a Butterworth low pass filter with configurable passband and stopband frequencies may be used. As an example, a passband of the IIR filter may be 0.001 Hz with 0.02 dB ripple and the stopband may be 0.05 Hz with 10 dB ripple. The IIR filter may generate a signal that is smoother than the preprocessed signal 324 and delayed relative to the preprocessed signal 324. It should be understood that various other types of filters may be used to generate the delayed signal with sufficient smoothing.

A detection signal may be determined based on a difference between the preprocessed signal 324 and the delayed signal. The detection signal may be used to detect the power generation deficiency (e.g., the tripped generator). For example, the detection signal, $x_{det}^l$, may be determined by:

$$x_{det}^l[n]=x_{pp}^l[n]x_{del}^l[n],$$

where $x_{pp}^l$ is the preprocessed signal 324 for an $l^{th}$ asset of a total L assets of the power delivery system, $x_{del}^l$ is the delayed signal generated by the IIR filter, and n is a timestamp. A sudden change in the detection signal may indicate a start of a power generation deficiency (e.g., the tripped generator). That is, a relatively fast deviation of the preprocessed signal from the delayed signal may indicate an issue with the power delivery system.

Figure 9:
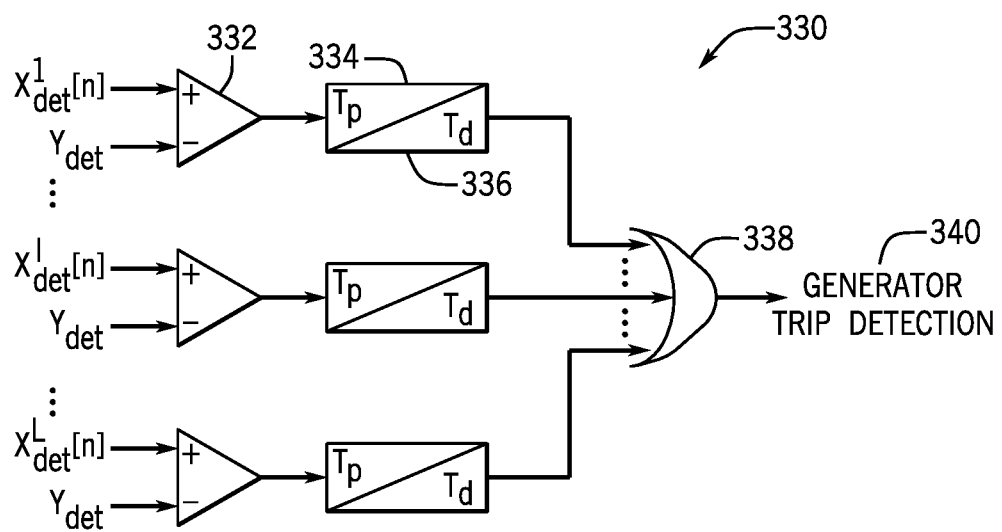
FIG. 9 is a block diagram of an event detection algorithm according to the analysis engine of FIG. 5, according to embodiments of the present disclosure.

A detection threshold may be used to determine whether a sudden change in the detection signal indicates a power generation deficiency. For example, FIG. 9 illustrates an event detection algorithm 330 to detect the generator trip event. As shown, the detection signal for each timestamp n, is compared to a detection threshold $\gamma_{det}$ using a number of comparators 332. The detection threshold $\gamma_{det}$ may be determined based on a variation of a frequency of the power delivery system during steady-state conditions (e.g., normal operating conditions) of the delivery system. A pickup time $T_p$ and a dropout time $T_d$ may be determined or set by a user using user processing 204 of FIG. 2 for the trip event monitoring. If any value of the detection signal satisfies the detection threshold $\gamma_{det}$, a logic OR gate 338 will output a signal 340.

Turning briefly to FIG. 11A, the signal 340 of FIG. 9 may indicate that a generator trip event, which actually occurred at a time 362, has been detected based on signals from a time 364. In other words, while the generation trip event may be detected at the time 364, the actual generation trip event happened at the time 362. Upon detection of the generation trip event at the time 364, analysis may be performed to identify the time 362 at which the generation trip event actually occurred.

Returning to the discussion of FIG. 9, any suitable number of values of the detection signal may be used to indicate that a generator trip event has occurred. For example, in some embodiments, the detection algorithm 330 may indicate that a generator trip event has occurred if at least two signals cross the detection threshold.

Figure 10A:
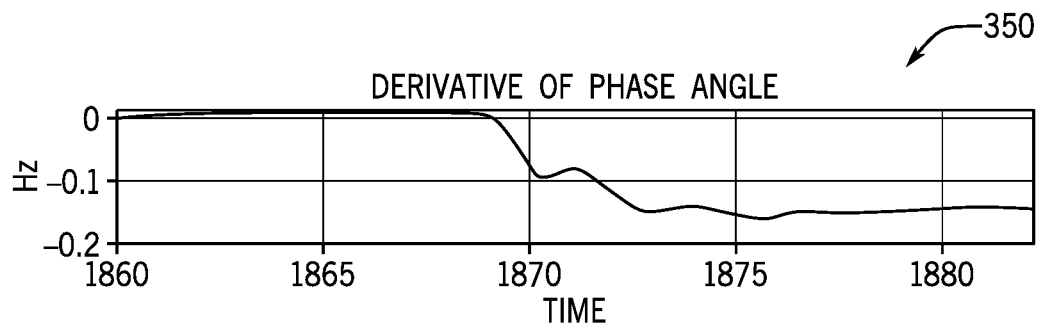
FIG. 10A is a graph illustrating a derivative of a phase angle of an example generator trip event discussed with respect to FIGS. 5-9, according to embodiments of the present disclosure.
Figure 10B:
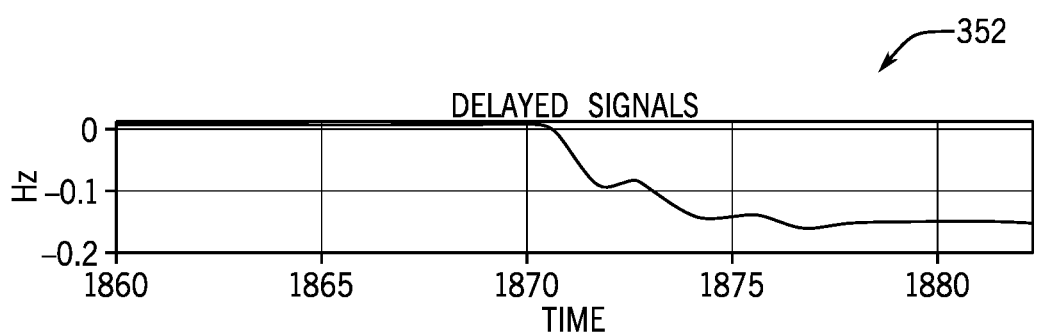
FIG. 10B is a graph illustrating a delayed signal generated by the analysis engine of FIG. 5 for the example generator trip event, according to embodiments of the present disclosure.
Figure 10C:
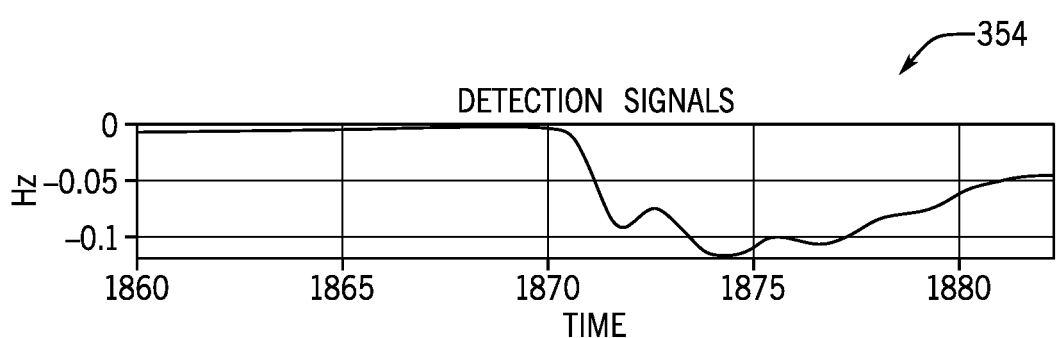
FIG. 10C is a graph illustrating a detection signal generated by the analysis engine of FIG. 5 for the example generator trip event, according to embodiments of the present disclosure.
Figure 11B:
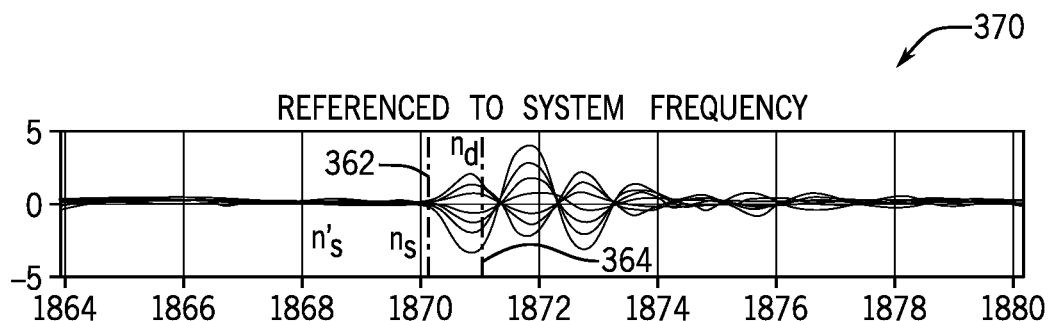
FIG. 11B is a graph illustrating a few preprocessed signals referenced to system frequency during the example generator trip event that are used to calculate one of the metrics shown in FIG. 10C, according to embodiments of the present disclosure.

FIGS. 10A-10C are graphs depicting signals of the example generator trip event discussed with respect to FIGS. 5-9. Specifically, FIG. 10A illustrates a derivative of the phase angle 350 determined during the preprocessing 304 of the input data stream 302. The derivative of the phase angle 350 of FIG. 10A illustrates a portion of the derivative 324 illustrated in FIG. 8. FIGS. 10B and 10C illustrate a delayed signal 352 and a detection signal 354, respectively, generated during the event detection 306 of FIG. 5. FIG. 11A illustrates preprocessed signals 360 ($f_r^j[n]$) that may be determined in the preprocessing operation 304, which is described further below. FIG. 11B illustrates the preprocessed signals 360 plotted relative to the system frequency 370. As will be discussed below, these signals may be used to calculate a sum of relative frequency signals energy $E_r[n]$.

Figure 11C:
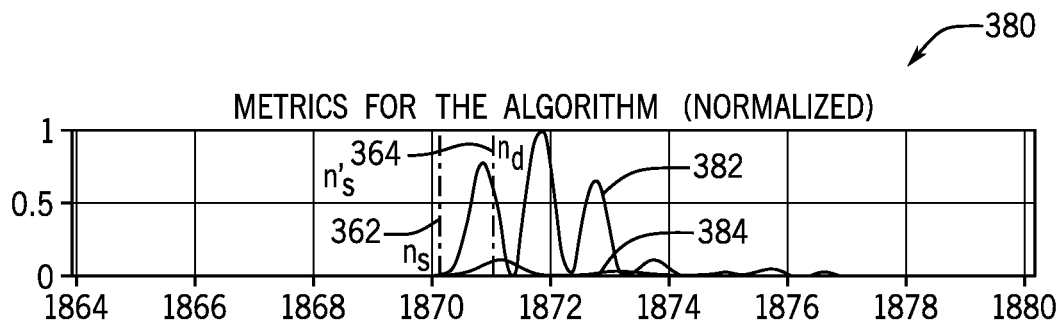
FIG. 11C is a graph illustrating metrics associated with the example generator trip event, according to embodiments of the present disclosure.

Upon the detection of the event at the time 364 from the event detection 306 determining that generator trip event has occurred, a source and propagation of the event 308 may be determined. Initially, each location (e.g., a location of an asset) that indicates a detection event may be considered to be a source location of the event. For example, a subset of a preprocessed signals for each asset j of the L assets which indicate a trigger event (e.g., the generator trip event) may be represented by:

$$\{f_{pp}^{(j)}[n]\}, j=1,2,\ldots,J,$$

where J≤L. An onset $n_s$ at the time 362, illustrated in FIGS. 11A-13, of the generator trip event may be found by moving back in time from a sample index when the event is first detected at time 364, $n_d$. To do so, a mean difference energy $E_{md}$ 382 and a sum of relative frequency signals energy $E_r[n]$ 384 may be used. These metrics have a sinusoidal nature due to a ringdown type response caused by the generator trip event which makes the metrics approximately 90 degrees out of phase. These metrics 382, 384 are illustrated in FIG. 11C. The mean difference energy $E_{md}$ 382 may be determined by:

$$f_c[n] = \frac{1}{J}\sum_{j=1}^{J} f_{pp}^j[n]$$

$$f_c'[n] = f_s \times (f_c[n+1] - f_c[n])$$

$$E_{md}[n] = |f_c'[n]|^2$$

where $f_s$ is the sampling rate of the signals. The sum of relative frequency signals energy $E_r[n]$ 384 may be determined by:

$$f_r^j[n]=f_{pp}^j[n]-f_c[n]$$

$$E_r[n]=\Sigma_{j=1}^J |f_r^j[n]|^2.$$

Starting from the sample time index when the event is first detected, $n_d$, that corresponds to the time 364 and going back in time to a sample time index before the event, $n_s' \leq n_s$, until $E_{md}[n] \leq \gamma_{md}$ and $E_r[n] \leq \gamma_r$, where $\gamma_{md}$ is a mean difference energy threshold and $\gamma_r$ is a sum of relative frequency signals energy threshold determined using a maximum lookback sample $N_{max}=300$ (at 30 samples per second), and a deviation in terms of standard deviation $D_{std}=30$:

$$\gamma_{md} = \frac{std(\{E_{md}[n]\})}{D_{std}}, n = n_d, n_d - 1, \ldots, n_d - N_{max}$$

$$\gamma_r = \frac{std(\{E_r[n]\})}{D_{std}}, n = n_d, n_d - 1, \ldots, n_d - N_{max}$$

The onset of the generator trip event, $n_s$, that corresponds to the time 362 can be determined by moving forward in time from $n_s'$ where the system may be assumed to be in normal steady-state condition prior the trip event. From the steady state, the frequency may decrease due to the generator trip event. Thus, the onset $n_s$ is determined by moving forward in time from $n_s'$ until $f_{pp}^j[n] \leq \gamma_f$, where:

$$\gamma_f = \text{median}(\{f_{pp}^j[n]\}:j=1,2,\ldots,J,n=n_s'-1, n_s',n_s'+1)-\Delta_f,$$

And $\Delta_f$ determines the deviation from pre-generator trip event to a post event deviation in frequency that is used to determine the onset of the event, $n_s$, 362. The signals are traversed for all preprocessed signals $x_{pp}^j[n]$, $j=1, 2, \ldots, J$ and sample indices $n_s^j$ for each signal that intersects the threshold $\gamma_f$. A smallest value of all indices $n_s^j$, $j=1, 2, \ldots, J$ is considered the onset $n_s$ of the generator trip event.

Figure 12:
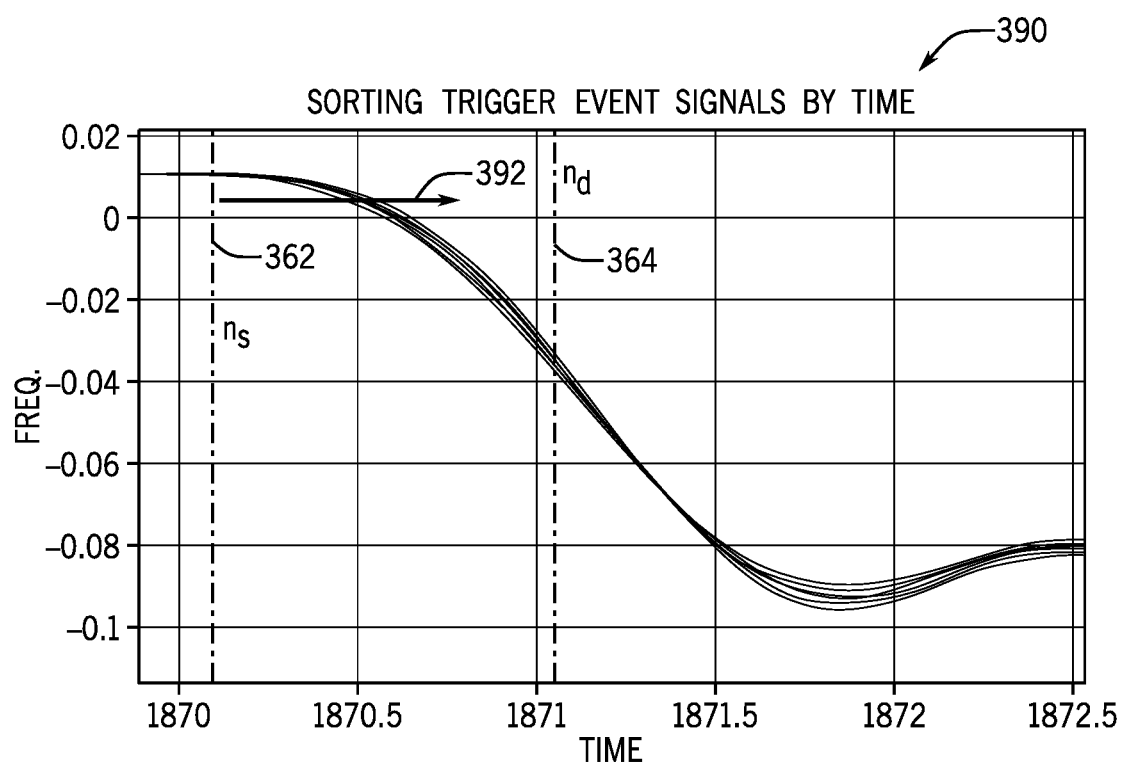
FIG. 12 is a graph illustrating sorting of the signals corresponding to trigger events based on a time, according to an embodiment of the present disclosure.

To determine a source of the event, all locations that indicate an event (as determined during the event detection 306 discussed above) are sorted by a time of the corresponding sample indices $n_s^j$, $j=1, 2, \ldots, J$ from smallest to largest. That is, it is assumed that the faster the frequency drops at a location, the closer that location is to the source of the event. Thus, the earlier the frequency drops below a particular value, the closer to the location of the tripped generator. FIG. 12 is a graph 390 illustrating sorting of the signals corresponding to trigger events based on a time at which a corresponding frequency drops below the particular frequency value. An arrow 392 represent the direction of the sorting, from earliest in time to latest in time.

Figure 13:
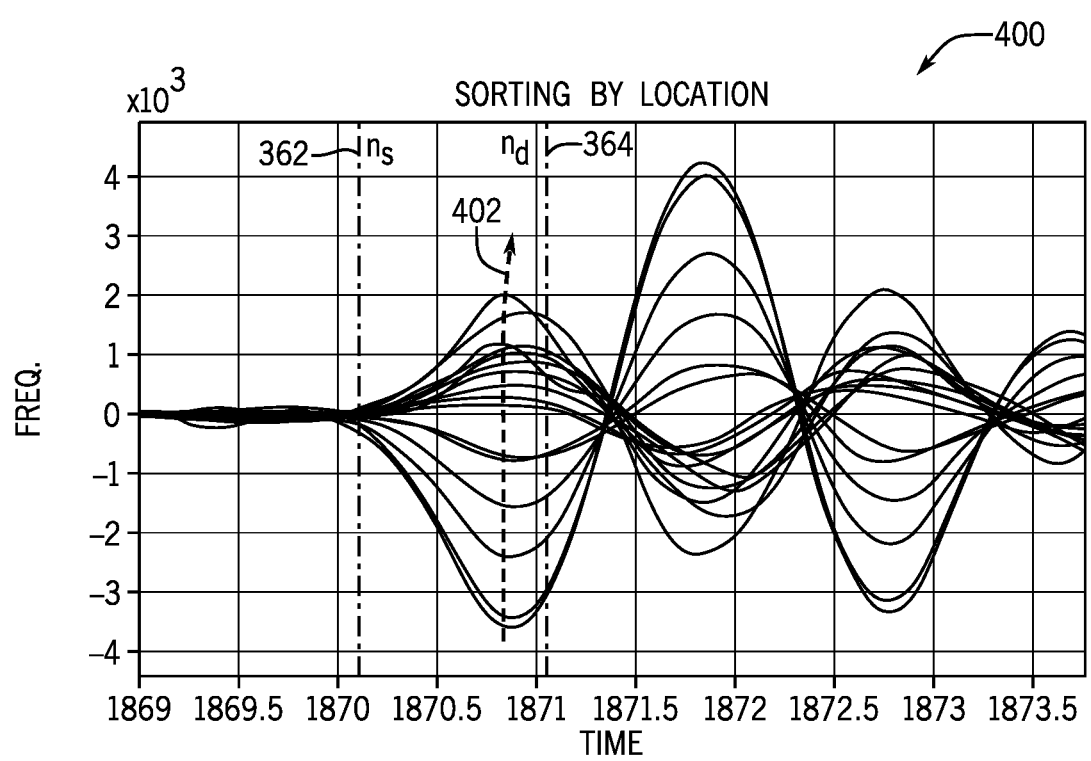
FIG. 13 is graph illustrating sorting of locations in a power delivery system which indicate a power deficiency event, according to embodiments of the present disclosure.

However, sorting by time may result in a number of corresponding locations have the same value of the sample indices, $n_s^j$, since the time duration of each sample may be not be fast enough to distinguish between all of the signals. In that case, those locations may be sorted based on the value $f_r^j[n_s^j]$ from smallest to largest. FIG. 13 is a graph 400 with an arrow 402 indicating the direction of the sorting by value. The smaller the value, the closer the corresponding location is to the source of the event. Thus, sorting by value from smallest to largest provides an indication of how the event propagated through the power delivery system. Indeed, by sorting by value (FIG. 13) those locations that are earliest when sorted by time (FIG. 12), the location of the event may be identified. To reiterate, when sorting by time (FIG. 12), there may be multiple signals that have the same timestamps. If there are multiple signals that have the same timestamp, those signals may be sorted by value (FIG. 13) to identify the earliest signal overall and thus to determine the location of the event.

Once the source and propagation of the event 308 are determined, the results 310 may be displayed via the information display 208 of the system 200 of FIG. 2. In this way, the results of the analysis engine 300 may be displayed to a user/operation of the system 200 to identify a particular asset (and location of the asset) which may need to be repaired or replaced or may have gone offline. That is, the user/operator may become aware of a particular asset which caused the event to occur in near real-time of the event taking place. Thus, any remedial action (e.g., repair or replacement) with respect to the asset can be initiated as soon as possible to the occurrence of the event in order to minimize downtime of the asset and all assets downstream in the power delivery system.

Figure 14A:
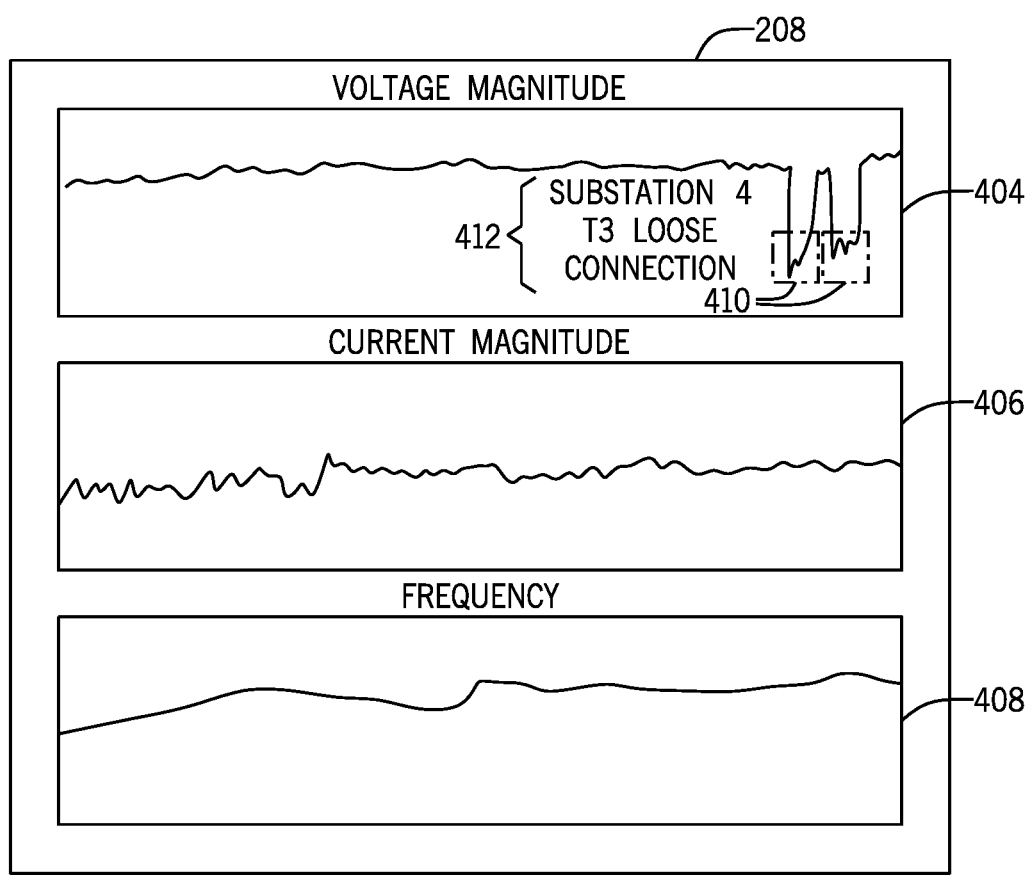
FIG. 14A illustrates an example information display including an overlay to indicate an event in the power delivery system related to the voltage magnitude input signal, according to embodiments of the present disclosure.
Figure 14B:
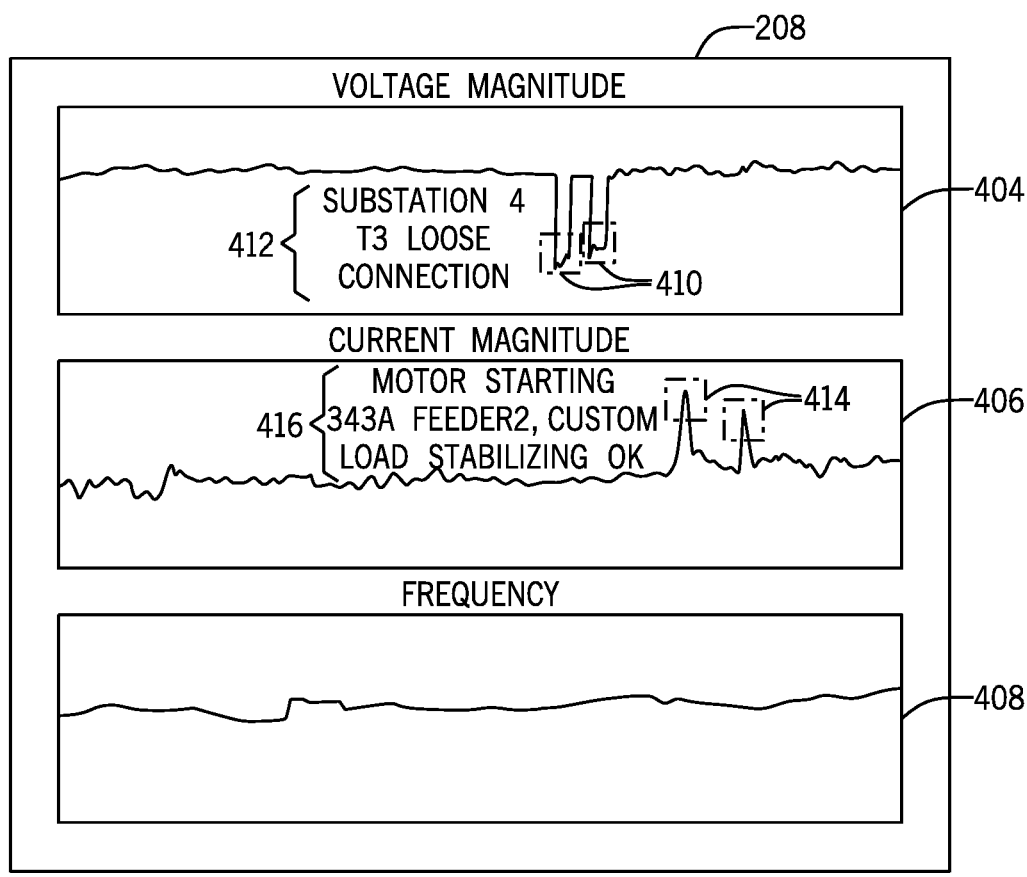
FIG. 14B illustrates the example information display of FIG. 14A including an overlay to indicate an event in the power delivery system related to the current magnitude input signal, according to embodiments of the present disclosure.
Figure 14C:
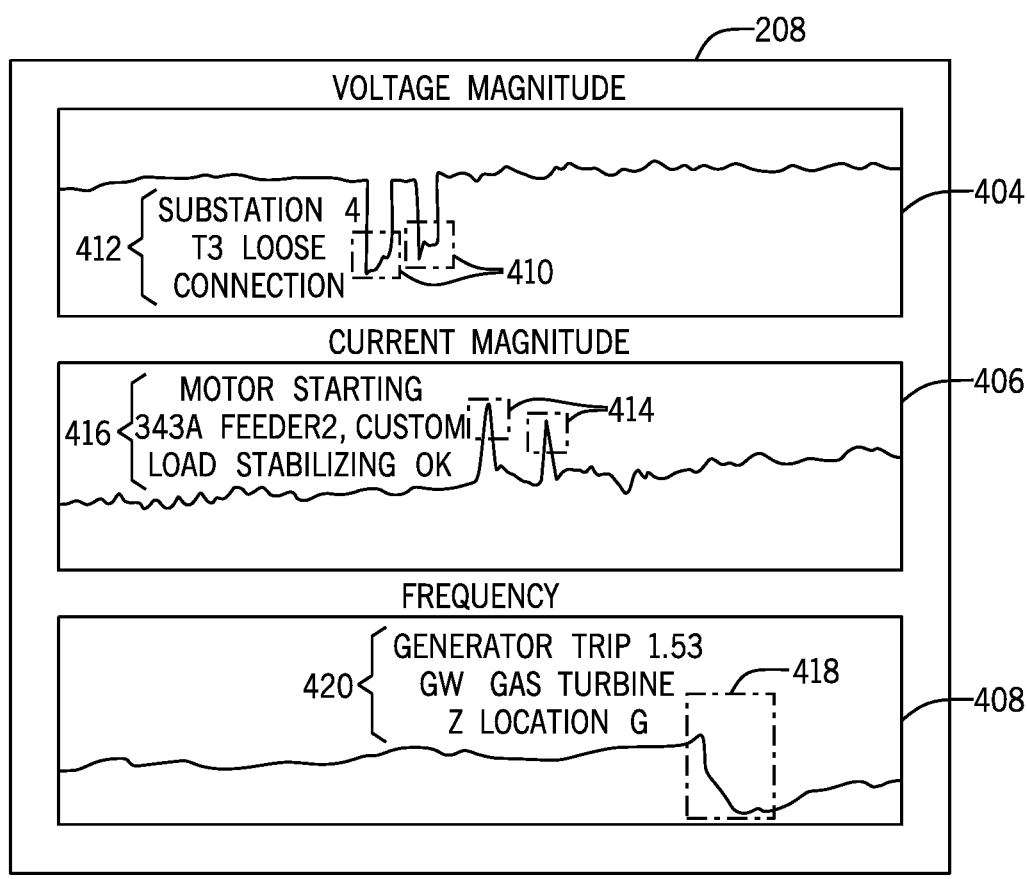
FIG. 14C illustrates the example information display of FIGS. 14A and 14B including an overlay to indicate an event in the power delivery system related to the frequency input signal, according to embodiments of the present disclosure.

FIGS. 14A-14C illustrate a time series of the input data 302 on an information display 208 of the system 200 of FIG. 2, including an overlay on the information display 208 to indicate potential events in the power delivery system related to the input signal, according to embodiments of the present disclosure. As shown, the information display 208 includes various parameters of the power delivery system, including a voltage magnitude 404, a current magnitude 406, and a frequency 408. The input data stream 302 may be received by the analysis engine 300 and the information display 208. While the data 302 is being output on the information display 208, the analysis engine may analyze the data 302 to detect an event and determine a location of the event within the power delivery system. Once the event is detected, the analysis engine 300 may generate a box 410 around the data corresponding to the event and output any relevant information 412 known at that time (e.g., a type of event such as a generator tripping, a loose connection, etc.). As the analysis engine 300 determines additional information regarding the event, the information 412 on the information display 208 may be updated. For example, the analysis engine 300 may determine a location of the event, a corresponding asset of the delivery system, etc. After the information display 208 is updated regarding the event, the analysis engine 300 may continue to monitor the input data stream 302 to identify additional events. As long as the data corresponding to the event is displayed on the information display, the corresponding box 410 and event information 412 may remain visible to a user/operation of the information display 208.

For example, FIG. 14B illustrates a subsequent view of the information display 208 (e.g., subsequent to the view illustrated in FIG. 14A). As shown, the box 410 and event information 412 associated with the event related to the voltage magnitude 404 remains on the display 208 even though additional input data 302 has been received. As shown, an analysis engine, such as the analysis engine 300 has detected an event related to the input data associated with the current magnitude 406. The analysis engine 300 generated a box 414 around the corresponding input data 302 for the current magnitude 406 and has output information 416 related to that event (e.g., a type of event, a location of the event, and status information) via the information display 208. It should be understood that the analysis engine which detected the event associated with the voltage magnitude 406 may be different from the analysis engine which detected the event associated with the voltage magnitude 404 discussed with respect to FIG. 14A.

FIG. 14C illustrates a view of the information display 208 subsequent to the view illustrated in FIG. 14B. For example, the events, and corresponding boxes and event information, for the voltage magnitude 404 and the current magnitude 406, discussed with respect to FIGS. 14A and 14B, respectively remain on the information display but have moved toward the left as additional input data 302 has been received. Additionally, as shown, an analysis engine, such as the analysis engine 300 of FIG. 5, has detected an event associated with the delivery system frequency 408. As shown, that analysis engine has generated a box 418 around the input data 302 corresponding to the event and output information 420 related to the event to be displayed on the information display 208. It should be understood that the analysis engine which detected the event associated with the system frequency 408 may be different than the analysis engines which detected the events associated with the voltage magnitude 404 and the current magnitude 406.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A system comprising:
a display configured to provide a visualization of input data associated with an electric power delivery system; and
processing circuitry configured to be coupled to the display, the processing circuitry configured to:
monitor the input data;
process the input data to detect an event associated with the electric power delivery system;
identify an onset of the event;
determine a propagation of the event through the electric power delivery system; and
generate an overlay to be output on the display with the input data that indicates a portion of the input data that is associated with the event.

2. The system of claim 1, wherein processing circuitry comprises a plurality of analysis engines, wherein each analysis engine of the plurality of analysis engines is associated with a different algorithm, and wherein each algorithm is configured to detect a different type of event associated with the electric power delivery system.

3. The system of claim 1, wherein the overlay comprises information related to a corresponding type of event.

4. The system of claim 1, wherein the processing circuitry is configured to detect the event by generating a detection signal based on a difference between the input data and a delayed signal based on the input data.

5. The system of claim 1, wherein the processing circuitry is configured to determine a geographic location of the event based at least in part on the input data.

6. The system of claim 5, wherein the processing circuitry is configured to:
analyze a signal based on a derivative of the input data relative to system frequency of the electric power delivery system to determine a sum of relative frequency signals energy; and
determine the geographic location of the event based at least in part on the sum of relative frequency signals energy.

7. The system of claim 1, wherein the electric power delivery system comprises a plurality of industrial assets.

8. The system of claim 7, wherein the event is associated with a first industrial asset of the plurality of industrial assets of the electric power delivery system.

9. The system of claim 8, wherein the processing circuitry is configured to determine a geographic location of the first industrial asset associated with the event.

10. The system of claim 8, wherein the overlay comprises information related to the first industrial asset and the event.

11. A system comprising:
a display; and
an analysis engine configured to:
receive an input data stream collected over time associated with an electric power delivery system;
identify an event associated with an asset of the electric power delivery system based on a portion of the input data stream;
generate an overlay for the portion of the input data stream associated with the event; and
transmit the overlay to the display to be presented via the display, wherein the overlay remains associated with the portion of the input data stream on the display when additional input data is received.

12. The system of claim 11, wherein the overlay provides an indication of the event and comprises information about the asset of the electric power delivery system.

13. The system of claim 12, wherein the information about the asset of the electric power delivery system comprises a geographic location of the asset based at least in part on the input data stream.

14. The system of claim 11, wherein the input data stream comprises a number of input signals and the analysis engine is configured to:
generate a plurality of delayed signals based on the number of input signals;
generate a plurality of detection signals based on a difference between the delayed signals and the input signals; and
identify a subset of the plurality of detection signals that satisfy a threshold;
wherein the event is identified using the plurality of detection signals that satisfy the threshold.

15. The system of claim 14, wherein the threshold is based on a variation of a steady-state frequency of the electric power delivery system.

16. The system of claim 14, wherein the number of delayed signals are generated using an infinite impulse response filter.

17. The system of claim 16, wherein the infinite impulse response filter comprises a Butterworth low pass filter.

18. A system, comprising:
a display;
a storage comprising historical data associated with a number of assets of an electric power delivery system; and
a plurality of analysis engines configured to:
retrieve the historical data;
generate a plurality of delayed signals based on the historical data;
generate a plurality of detection signals based on a difference between the delayed signals and the historical data;
identify a subset of the plurality of detection signals that satisfy a threshold; and
determine a geographic location of an event within the electric power delivery system based at least in part on the subset of the plurality of detection signals.

19. The system of claim 18, wherein the plurality of analysis engines are configured to update a machine learning model based at least in part on the geographic location of the event.

20. The system of claim 18, wherein the threshold is based at least in part on a variation of a steady-state frequency of the electric power delivery system.

21. The system of claim 18, wherein the assets of the electric power delivery system comprise generators and the event comprises a power generation loss of at least one generator.

* * * * *